United States Patent
Ito

(10) Patent No.: US 8,916,246 B2
(45) Date of Patent: Dec. 23, 2014

(54) ANNULAR STRUCTURE HAVING EXCELLENT HEAT INSULATING AND HEAT RELEASING PROPERTIES

(75) Inventor: Yasutaka Ito, Ibi-gun (JP)

(73) Assignee: Ibiden Co., Ltd., Ogaki-shi (JP)

(*) Notice: Subject to any disclaimer, the term of this patent is extended or adjusted under 35 U.S.C. 154(b) by 739 days.

(21) Appl. No.: 11/849,552

(22) Filed: Sep. 4, 2007

(65) Prior Publication Data

US 2008/0107844 A1    May 8, 2008

(30) Foreign Application Priority Data

Sep. 12, 2006 (JP) ................... 2006-247063

(51) Int. Cl.
    *B32B 18/00* (2006.01)
    *C23C 24/00* (2006.01)
    *C30B 35/00* (2006.01)
    *C23C 30/00* (2006.01)
    *C23C 24/10* (2006.01)
    *C30B 15/14* (2006.01)

(52) U.S. Cl.
    CPC .............. *C23C 24/10* (2013.01); *C23C 24/00* (2013.01); *C30B 35/00* (2013.01); *C23C 30/00* (2013.01); *C30B 15/14* (2013.01)
    USPC ........ 428/34.4; 428/34.6; 428/35.7; 428/35.8

(58) Field of Classification Search
    USPC ............ 428/220, 312.6, 390, 428, 34.4, 34.6, 428/35.7, 35.8; 60/323, 320
    See application file for complete search history.

(56) References Cited

U.S. PATENT DOCUMENTS

| | | | |
|---|---|---|---|
| 5,250,360 A * | 10/1993 | Andrus et al. | 428/471 |
| 5,468,290 A | 11/1995 | Kelley | |
| 6,461,415 B1 * | 10/2002 | Sambasivan et al. | 106/14.21 |
| 6,602,623 B1 * | 8/2003 | Mizutani et al. | 428/702 |
| 6,900,149 B1 | 5/2005 | Ito et al. | |
| 6,964,812 B2 | 11/2005 | Ito et al. | |
| 7,015,166 B2 | 3/2006 | Ito et al. | |
| 2003/0070585 A1 | 4/2003 | Park et al. | |
| 2004/0138058 A1 * | 7/2004 | Sambasivan et al. | 502/208 |
| 2005/0014031 A1 | 1/2005 | Hiramatsu et al. | |
| 2005/0153826 A1 | 7/2005 | Ito et al. | |
| 2007/0163250 A1 * | 7/2007 | Sane et al. | 60/323 |

FOREIGN PATENT DOCUMENTS

| | | |
|---|---|---|
| EP | 0290322 | 11/1988 |
| EP | 1245548 | 5/2001 |
| JP | 59-8639 | 1/1984 |
| JP | 61-179881 | 8/1986 |
| JP | 62-59552 | 3/1987 |
| JP | 02-047555 B | 10/1990 |
| JP | 03-062798 B | 9/1991 |
| WO | WO 2005/005680 A2 | 1/2005 |
| WO | WO 2005/005680 A3 | 1/2005 |
| WO | WO 2005/091902 A2 | 10/2005 |

* cited by examiner

*Primary Examiner* — Ellen S Raudenbush

(74) *Attorney, Agent, or Firm* — Oblon, Spivak, McClelland, Maier & Neustadt, L.L.P.

(57) ABSTRACT

A structure of the present invention is the structure which is formed of a base made of a metal and an inorganic material surface layer made of crystalline and amorphous inorganic materials, wherein thermal conductivity of the inorganic material surface layer is lower than the thermal conductivity of the base, infrared emissivity of the inorganic material surface layer is higher than the infrared emissivity of the base, and the base is an annular body.

20 Claims, 3 Drawing Sheets

ANNULAR STRUCTURE HAVING EXCELLENT HEAT INSULATING AND HEAT RELEASING PROPERTIES

CROSS-REFERENCE TO RELATED APPLICATIONS

This application claims benefit of priority based on Japanese patent application JP 2006-247063 filed on Sep. 12, 2006. The contents of this application are incorporated herein by reference in their entirety.

BACKGROUND OF THE INVENTION

1. Field of the Invention

The present invention relates to a structure.

2. Discussion of the Background

It is desired that, in heating furnaces used for growing crystals and the like at a high temperature, a time for raising the temperature to a predetermined processing temperature be short in order to shorten the processing time, while it is also desired that the temperature in the furnace should not rise excessively over the processing temperature after the temperature has reached the predetermined processing temperature, in order to make the heat treatment temperature stable.

For example, when growing an InGaSb crystal, a lump of GaSb material is placed in a heating furnace and an InGaSb material is placed thereon, and the heating furnace is inductively heated so that the temperature in the heating furnace is held between the melting point of GaSb (712° C.) and the melting point of InGaSb (in the range of 525° C. to 712° C.). When heating is carried out in this manner, only the InGaSb material melts to form an InGaSb crystal solution, which accumulates on top of the GaSb lump. Therefore, an InGaSb monocrystal can be grown by bringing a GaSb seed crystal into contact with this solution and pulling it up while rotating it, maintaining constant temperature of the InGaSb solution.

In the above mentioned process, it is desirable that the time for raising the temperature in the heating furnace to 525° C. or higher be short, while the temperature of the furnace should not exceed 712° C.

On this condition, in order to shorten the time for raising the temperature, it is effective to improve the heat insulating property inside the furnace in a low temperature region, thus, it is considered to be desirable to fabricate the furnace body (inner wall of the furnace) from a material having excellent heat insulating property, namely, a material having a low thermal conductivity.

Further, in order to prevent excessive rising of the temperature in the furnace exceeding the processing temperature, it is effective to enhance the heat releasing property in a high temperature region so that the temperature of the furnace body cannot easily rise in a high temperature region. Therefore, it is considered to be desirable to fabricate a furnace body from a material having excellent heat releasing property, namely, a material having a high emissivity.

Here, JP-B 2-47555 discloses a far infrared radiator comprises an inorganic compound coating film formed of oxide based ceramics and high-expansion glass with a low melting point on the surface of a metal base, as a material having excellent heat releasing property.

Further, JP-B 3-62798 discloses an infrared radiator comprises a high-infrared radiation coating film (black color at room temperature) formed of metal oxide and high-expansion glass with a low melting point on the surface of a metal base, as a material having similarly excellent heat releasing property.

The contents of JP-B 2-47555, JP-B 3-62798 are incorporated herein by reference in their entirety.

SUMMARY OF THE INVENTION

The structure of the present invention is a structure formed of a base made of a metal and an inorganic material surface layer made of crystalline inorganic material and amorphous inorganic material, wherein thermal conductivity of the above mentioned inorganic material surface layer is lower than the thermal conductivity of the above mentioned base, infrared emissivity of the above mentioned inorganic material surface layer is higher than the infrared emissivity of the above mentioned base, and the above mentioned base is an annular body.

Further, it is desirable that, in the structure of the present invention, the thermal conductivity of the above mentioned inorganic material surface layer at room temperature be at least about 0.1 W/mK and at most about 2.0 W/mK.

Further, it is desirable that, in the structure of the present invention, the emissivity of the above mentioned inorganic material surface layer at room temperature at a wavelength in the range of 1 µm to 15 µm be at least about 0.70 and at most about 0.98.

Further, it is desirable that, in the structure of the present invention, a degree of irregularities ($Rz_{JIS}$) on the surface of the above mentioned base be about 1/60 or more of a thickness of the above mentioned inorganic material surface layer.

Further, it is desirable that, in the structure of the present invention, the inorganic material surface layer be formed on the outer surface of the base, on the inner surface of the base, or on both of the outer surface and the inner surface of the base.

Further, it is desirable that, in the structure of the present invention, the material of the base includes steel, iron, copper, Inconel, Hastelloy, Invar, or stainless steel; the crystalline inorganic material be at least one kind selected from the group consisting of manganese dioxide, manganese oxide, iron oxide, cobalt oxide, copper oxide and chromium oxide; and the amorphous inorganic material be at least one kind selected from the group consisting of barium glass, boron glass, strontium glass, alumina-silicate glass, soda zinc glass and soda barium glass.

Further, it is desirable that, in the structure of the present invention, the softening temperature of the amorphous inorganic material be at least about 400° C. and at most about 1000° C.; and the difference in the thermal expansion coefficient between the inorganic material surface layer and the base be about $10 \times 10^{-6}/°$ C. or less.

DESCRIPTION OF THE EMBODIMENTS

First, the structure of the present invention is described with reference to the drawings.

The structure of the present invention is a structure formed of a base made of a metal (hereinafter also referred to as metal base) and an inorganic material surface layer made of crystalline and amorphous inorganic materials, wherein thermal conductivity of the above mentioned inorganic material surface layer is lower than the thermal conductivity of the above mentioned base, infrared emissivity of the above mentioned inorganic material surface layer is higher than the infrared emissivity of the above mentioned base, and the above mentioned base is an annular body.

Figure 2A:
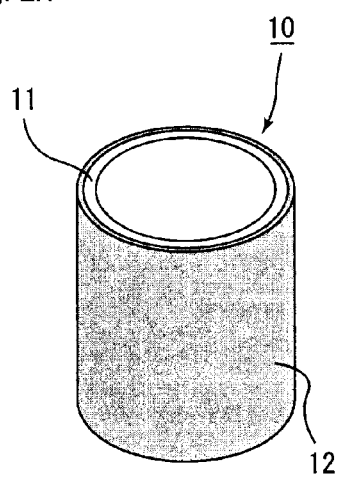
FIGS. 2A, 2B, 2C and 2D are perspective views schematically showing respective examples of the structure of the present invention.
Figure 2B:
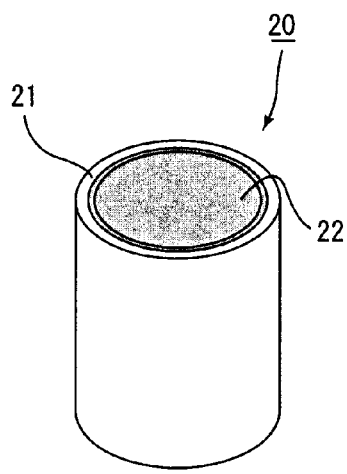
Figure 2C:
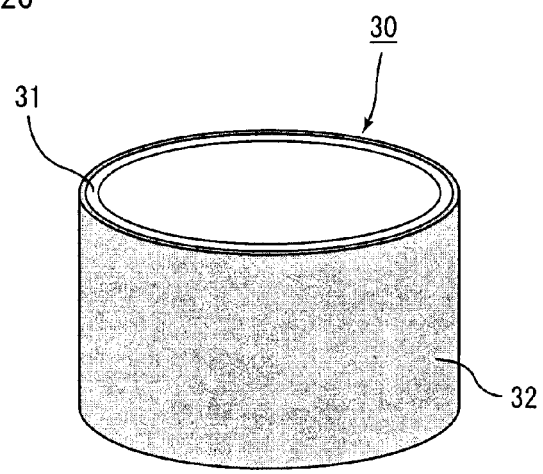
Figure 2D:
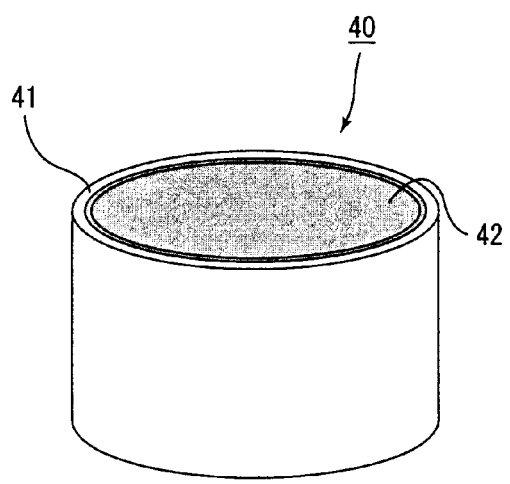

FIGS. 2A, 2B, 2C and 2D are perspective views schematically showing exemplary structures of the present invention. FIGS. 2A and 2B show structures in cylindrical shapes and FIGS. 2C and 2D show structures in cylindroid shapes, and an inorganic material surface layer is formed on the outer surface or the inner surface of each base.

Since these all have the same properties, a description of the structure of the present invention will be set forth in the structure in cylindrical shape shown in FIG. 2A as an example.

A structure 10 shown in FIG. 2A has a double structure where the outer surface of a metal base 11 in cylindrical shape made of a metal is coated with an inorganic material surface layer 12 made of crystalline and amorphous inorganic materials so that two kinds of materials having different radii adhered with each other.

Further, the inorganic material surface layer 12 is formed so that the thermal conductivity at room temperature is lower than that of the metal base 11 and the infrared emissivity at room temperature is higher than that of the metal base 11.

Here, in the present description, "room temperature" refers to a temperature at about 25° C.

Further, in the present description, thermal conductivity of the inorganic material surface layer is the thermal conductivity of a mixture of a crystalline inorganic material and an amorphous inorganic material at room temperature, and is determined by the respective thermal conductivities of the crystalline inorganic material and the amorphous inorganic material which form the inorganic material surface layer, the ratio of mixture and the like.

Further, the inorganic material surface layer 12 which forms the structure of the present invention is formed so that its thermal conductivity is lower than the thermal conductivity of the metal base 11 throughout the entirety of a low temperature region.

Further, though the low temperature region and the high temperature region in the present description differ depending on the application and a material of the metal base and inorganic material surface layer which form the structure, and are not particularly limited, for example, in the case where the metal base is made of an SUS430 material and the inorganic material surface layer is formed of a crystalline inorganic material comprising $MnO_2$ and $CuO$ and an amorphous inorganic material comprising $SiO_2$—$BaO$ glass, the low temperature region is at least about 0° C. and at most about 500° C., and the high temperature region is at least about more than 500° C. and at most about 1000° C.

Since, in the structure of the present invention, the thermal conductivity of the inorganic material surface layer is lower than that of the metal base, for example, in the structure 10 of the present invention having a shape as shown in FIG. 2A, when the metal base 11 is heated by a heater which is attached to the inside of the metal base 11 or when the metal base 11 is heated with a heat source which is provided in the space inside the metal base 11, the rate of thermal conduction to the metal base 11 and the space inside the metal base 11 is high, while the rate of thermal conduction from the metal base 11 to the outside of the structure 10 through the inorganic material surface layer 12 is low. Therefore, the structure 10 of the present invention is a material having high heat insulating property as a whole and does not easily release heat to the outside in a low temperature region.

Accordingly, the temperature of the metal base 11 and in the space inside the metal base 11 can be quickly raised when heating the inside the structure 10 of the present invention.

Further, the infrared emissivity of the inorganic material surface layer 12 is higher than the infrared emissivity of the metal base 11. In the present description, the infrared emissivity of the inorganic material surface layer is the infrared emissivity of a mixture of a crystalline inorganic material and an amorphous inorganic material at room temperature, and is a property which is represented by the average value of the emissivity throughout the entirety of the infrared region.

Further, the inorganic material surface layer 12 which forms the structure of the present invention is formed so that its infrared emissivity is higher than the infrared emissivity of the metal base 11 in a high temperature region as well.

Here, the rate of radiative transfer from an object per unit area is proportional to the product of the temperature of the object to the 4th power and the emissivity of the object according to the Stefan-Boltzmann's law. Therefore, since the effects of the term of the temperature of the object to the 4th power become great in the high temperature region, the rate of radiative transfer dramatically increases in comparison with that in the low temperature region.

Therefore, since the rate of radiative transfer to radiate heat to the outside of the structure 10 through the inorganic material surface layer 12 can be increased by increasing the infrared emissivity of the inorganic material surface layer 12, the structure 10 of the present invention becomes a material having excellent heat releasing property, and thus, easily releases heat to the outside.

Accordingly, by using the structure 10 of the present invention, the rise of the temperature of the metal base 11 and in the space inside the metal base 11 in the high temperature region can be prevented.

Further, since the structure of the present invention is an annular body, leaking of a gas or a liquid from the inside of the structure to the external space can be prevented. Therefore, the heat insulating property inside the structure can be secured.

Further, by making the structure of the present invention an annular body, the temperature inside the structure can be decreased by improving the heat releasing property in the high temperature region where the heat releasing property depends on radiation.

Here, "the annular body" in the present description refers to, in a three-dimensional Cartesian coordinates where X, Y and Z axes are perpendicular to each other, a form closed in at least one plane among X-Y, Y-Z and Z-X planes. Accordingly, the annular body in the present description includes those of which the cross section perpendicular to the longitudinal direction is not only circular, but elliptical and rectangular.

Figure 1:
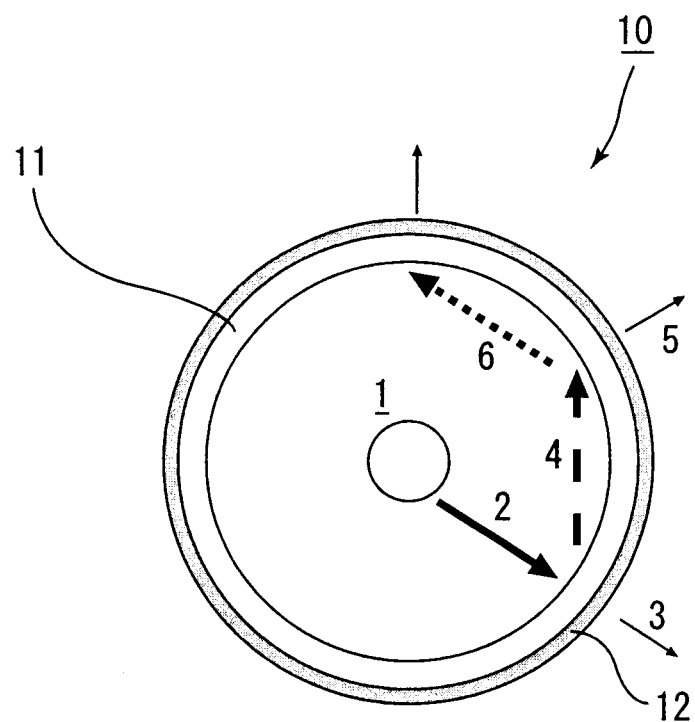
FIG. 1 is a top view schematically showing the manner in which radiation and reflection occur inside the structure of the present invention.

Though the reason why the heat releasing property improve by making the structure of the present invention an annular body is not clear, as shown in FIG. 1, when radiant heat 2 from heat source 1 enters into the inner wall of structure 10, radiant heat 3 is radiated from the surface of the structure 10 and the reflected radiant heat 4 enters into the inner wall of the structure 10 again. Then, radiant heat 5 is radiated again from the surface of the structure 10, and the reflected radiant heat 6 again enters into the inner wall of the structure 10. In this manner, it is assumed that the radiant heat is reflected continuously so that heat release progresses in the case where the structure is an annular body, and therefore, the heat releasing property is improved.

Further, though the above mentioned heat source is not particularly limited, examples include a furnace body, a heater, a reactive gas and oil for heating.

In particular, by making the structure of the present invention an annular body, a high temperature gas or liquid, such as a reactive gas or oil for heating as the above mentioned heat source, can run through inside the structure without being leaked to the external space.

As the material of the above mentioned base, metals such as steel, iron and copper, nickel-based alloys such as Inconel, Hastelloy and Invar, and other alloys such as stainless steel and the like, can be used. Since these metal materials have high thermal conductivity, in the case where these are used as the material of the base of the structure of the present invention, the rate of thermal conduction to the base and the space inside the base can be increased. Therefore, the time for raising the temperature to a predetermined temperature can be shortened.

Further, since these metal materials have high heat resistance, the metal materials can be used optimally in a temperature of at least about 500° C. and at most about 1000° C. Further, by using these metal materials for the base, the structure of the present invention becomes the relatively low cost structure superior in thermal shock resistance, processability and physical property.

A desirable lower limit of the thickness of the above mentioned base is about 0.2 mm, more desirably about 0.4 mm and a desirable upper limit is about 10 mm, more desirably about 4 mm.

This is because, in the case where the thickness is within the above-mentioned range, the structure tends to have sufficient strength, and the time for raising the temperature of the base tends to become short.

The above mentioned inorganic material surface layer is formed of crystalline and amorphous inorganic materials. Though the crystalline inorganic material is not particularly limited, it is desirable to use an oxide of a transition metal, and at least one kind selected from the group consisting of manganese dioxide, manganese oxide, iron oxide, cobalt oxide, copper oxide and chromium oxide is desirable.

The thermal conductivity of an oxide of transition metals like these is low in comparison with that of the metal base, and therefore, the rate of thermal conduction to the outside of the structure through the inorganic material surface layer can be decreased, and thus, the structure of the present invention becomes a structure having excellent heat insulating property.

Further, since an oxide of transition metals like these has a high emissivity in the infrared region, an inorganic material surface layer having a high emissivity can be formed. Therefore, the structure of the present invention becomes a structure having excellent heat releasing property.

The inorganic material surface layer may be provided on the outer surface of the annular-shaped metal base 11 and 31 as shown in FIGS. 2A and 2C, or may be provided on the inner surface of the annular-shaped metal base 21 and 41 as shown in FIGS. 2B and 2D.

Further, the inorganic material surface layer may be provided on both the inner and outer surface of the annular-shaped base. In this case, the heat insulating property and heat releasing property can be further improved.

The amorphous inorganic material is not particularly limited, however, it is desirable to use at least one kind selected from the group consisting of barium glass, boron glass, strontium glass, alumina-silicate glass, soda zinc glass and soda barium glass.

Since these amorphous inorganic materials are low melting glass of which the softening temperature is at least about 400° C. and at most about 1000° C., an inorganic material surface layer can be formed on the surface of a metal base easily and firmly by melting and applying the material onto the surface of a metal base, followed by a heating and firing process.

Further, since the thermal conductivity of these amorphous inorganic materials is low in comparison with that of the metal base, the rate of thermal conduction to the outside through the inorganic material surface layer can be decreased, and thus, the structure of the present invention becomes a structure having excellent heat insulating property.

Here, the thermal expansion coefficient of the crystalline inorganic material made of an oxide of a transition metal, among the materials that form the inorganic material surface layer, is as low as at least about $8\times10^{-6}$/° C. and at most about $9\times10^{-5}$/° C., while the thermal expansion coefficient of the amorphous inorganic material made of low melting glass is as high as at least about $8\times10^{-6}$/° C. and at most about $25\times10^{-6}$/° C., and therefore, it is possible to control the thermal expansion coefficient of the inorganic material surface layer by adjusting the mixture ratio of the above mentioned crystalline inorganic material and the above mentioned amorphous inorganic material. For example, since the thermal expansion coefficient of stainless steel, that is the metal base, is at least about $10\times10^{-6}$/° C. and at most about $18\times10^{-6}$/° C., by adjusting the mixture ratio of the above mentioned crystalline inorganic material and the above mentioned amorphous inorganic material, the thermal expansion coefficient of the inorganic material surface layer and that of the metal base can be made close, and thus, adhesiveness between the inorganic material surface layer and the metal base can be increased.

The desirable thermal expansion coefficient for the inorganic material surface layer differs, depending on the combination with the metal material of the base, but it is desirable that the difference in the thermal expansion coefficient between the inorganic material surface layer and the metal base be about $10\times10^{-6}$/° C. or less.

Though the mixture ratio of the crystalline inorganic material in the inorganic material surface layer can be adjusted in order to control the heat expansion coefficient as described above, a desirable lower limit is about 10% by weight, more desirably about 30% by weight, while a desirable upper limit is about 90% by weight, more desirably about 70% by weight. In the case where the mixture ratio of the crystalline inorganic material is within the above range, the heat releasing property at high temperatures tends to be excellent, and also the adhesiveness with the metal base tends to be excellent.

Further, a desirable lower limit of the thickness of the inorganic material surface layer is about 2 μm, and a desirable upper limit is about 50 μm. In the case where the thickness is within the above range, the heat insulating property at low temperatures tends to be excellent, and also formation of a film on the base (formation of inorganic material surface layer) tends to become easier.

Further, though the form of the structure of the present invention is not particularly limited, as long as it is an annular body, cylindrical form and cylindroid form, as shown in FIGS. 2A, 2B, 2C and 2D are desirable.

In the case of cylindrical form, as shown in FIG. 2A, a desirable lower limit of the diameter (outer diameter) is about 5 mm and a desirable upper limit is about 200 mm. By setting the diameter in the above mentioned range, heat releasing property and heat insulating property can be effectively gained.

Further, in the structure of the present invention, it is desirable that the thermal conductivity of the above mentioned inorganic material surface layer at room temperature be at least about 0.1 W/mK and at most about 2.0 W/mK.

The thermal conductivity of the inorganic material surface layer at room temperature can be measured using any of known measuring methods, for example, hot wire method, laser flash method and the like.

However, when the structure of the present invention is measured as it is, the thermal conductivity of the entire structure including the metal base is measured, and as the thermal conductivity of the inorganic material surface layer cannot be measured, it is necessary to separately prepare a sample for measurement.

More specifically, a crystalline inorganic material and an amorphous inorganic material are crushed and mixed at a predetermined ratio. Next, the mixture is heated to a temperature of the melting point of the amorphous inorganic material or more and kneaded in a state where the amorphous inorganic material is molten, and then, cooled and solidified to form a solid.

By processing this solid into a form which is appropriate for the respective measuring methods, and thus, the thermal conductivity can be measured using any of known measuring method.

The thermal conductivity of the oxide of a transition metal which can be used as the crystalline inorganic material is at least about 0.5 W/mK and at most about 2.0 W/mK at room temperature, while the thermal conductivity of low melting glass which can be used as an amorphous inorganic material is at least about 0.1 W/mK and at most about 1.2 W/mK at room temperature. Therefore, in the case where an inorganic material surface layer is prepared using these crystalline inorganic material and amorphous inorganic material, the thermal conductivity can be adjusted to at least about 0.1 W/mK and at most about 2.0 W/mK at room temperature.

In the structure of the present invention, when the thermal conductivity of the inorganic material surface layer at room temperature is at least about 0.1 W/mK and at most about 2.0 W/mK, the rate of thermal conduction to the outside through the inorganic material surface layer can be made considerably low. Therefore, a structure having highly excellent heat insulating property in a low temperature region can be provided.

Further, in the structure of the present invention, it is desirable that the emissivity of the above described inorganic material surface layer for a wavelength in the range of 1 μm to 15 μm be at least about 0.70 and at most about 0.98 at room temperature.

The emissivity of the inorganic material surface layer may be measured on the surface of the structure of the present invention on which the inorganic material surface layer is formed, or measured using a sample for measurement which is separately prepared in the same manner as for the measurement of the thermal conductivity. As for the method for measurement, a known spectrophotometry method can be used.

The emissivity of the oxide of a transition metal which can be used as the crystalline inorganic material for a wavelength in the range of 1 μm to 15 μm at room temperature is at least about 0.75 and at most about 0.98, while the emissivity of low melting glass which can be used as the amorphous inorganic material for a wavelength in the range of 1 μm to 15 μm at room temperature is at least about 0.65 and at most about 0.96. Therefore, in the case where an inorganic material surface layer is prepared using these crystalline inorganic material and amorphous inorganic material, the emissivity can be kept at least about 0.70 and at most about 0.98.

The wavelength range of 1 μm to 15 μm is a so-called near infrared and far infrared region and has great thermal effects. In the case where the emissivity in this region is at least about 0.70 and at most about 0.98, particularly in a high temperature region, the rate of radiative transfer from the inorganic material surface layer to the outside can be made considerably high. Accordingly, a structure having highly excellent heat releasing property in the high temperature region can be provided.

In addition, it is desirable that, in the structure of the present invention, the degree of irregularities ($Rz_{JIS}$) on the surface of the above mentioned base be about 1/60 or more of the thickness of the above mentioned inorganic material surface layer. Here, $Rz_{JIS}$ is a ten-point mean Roughness, defined in accordance with JIS B 0601: 2001.

The contents of JIS B 0601:2001 are incorporated herein by reference in their entirety.

When irregularities is formed on the surface of the base, the inorganic material surface layer can be made to adhere more firmly to the base, in comparison with a case where the surface of the base is smooth, and it is possible to form an inorganic material surface layer which does not peel even after the repetitive rises and falls of the temperature.

Further, in the case where the degree of irregularities on the surface of the base is about 1/60 or more of the thickness of the inorganic material surface layer, the inorganic material surface layer is formed along the irregularities on the surface of the base. Therefore the surface area of the inorganic material surface layer becomes larger, in comparison with a case where the surface of the base is smooth and the area which contributes to radiative transfer become wider, and thereby, the heat releasing property of the structure of the present invention can further be improved.

Next, a method for manufacturing a structure of the present invention is described.

The method for manufacturing a structure of the present invention includes the following steps of: a surface processing step of a metal base, a mixing step for preparing slurry by wet blending a crystalline inorganic material and an amorphous inorganic material, a coating step for applying the slurry to the metal base, and a firing step in which firing the metal base to which the slurry has been applied to fix an inorganic material coating film to the metal base.

First, the surface processing step to process the surface of a metal base is carried out.

The Surface processing of a metal base is a step in which impurities on the metal base is removed and irregularities is formed on the surface of the metal base, if necessary.

A method for removing impurities on a metal base is not particularly limited, and a general washing method can be used. For example, a method of ultrasonic cleaning in an alcohol solvent, and the like, can be used.

A method for forming irregularities on the surface of a metal base is also not particularly limited, a sandblasting, an etching or a high temperature oxidizing can be included as exemplary methods. These methods may be used alone, or a plurality of methods may be used in combination. As the above mentioned method for forming irregularities, any method that has been used conventionally can be adopted.

Here, the step of forming irregularities on the surface of a metal base is not an essential step, and may be omitted depending on the case.

Next, the mixing step of wet blending a crystalline inorganic material and an amorphous inorganic material is carried out.

In this step, a powdery crystalline inorganic material and a powdery amorphous inorganic material are respectively prepared so as to have a predetermined particle size and form, the respective powders are dry blended at a predetermined mixture ratio to prepare mixed powder, and furthermore, a slurry is prepared by adding water thereto and wet blending the mixture in a ball mill.

Though the mixture ratio of the mixed powder and water is not particularly limited, approximately 100 parts by weight of water to 100 parts by weight of mixed powder is desirable. This is because it is necessary to provide the slurry with an appropriate viscosity in order to apply to a metal base. Further, an organic solvent may be used, if needed.

Subsequently, the coating step of applying the slurry to the metal base is carried out.

In this step, the slurry that has been prepared in the mixing step is applied to the metal base, the surface of which has been processed in the surface processing step. The applying method is not particularly limited as long as it is a method that the slurry can be uniformly applied to the metal base, and spray coating, transferring or brush coating may be included as exemplary methods.

Subsequently, the firing step of firing the metal base, to which the slurry has been applied, is carried out.

In this step, after drying the metal base to which the slurry has been applied in the coating step, heating and firing are carried out to form an inorganic material surface layer. It is desirable that the firing temperature be the melting point of the amorphous inorganic material or more, and the temperature at least about 700° C. and at most about 1100° C. is desirable, though it depends on the type of the mixed amorphous inorganic material. By setting the firing temperature to be the melting point of the amorphous inorganic material or more, the metal base and the amorphous inorganic material can adhere firmly to each other and thus, an inorganic material surface layer which does not peel even after the repetitive rises and falls of the temperature can be formed.

EXAMPLES

Herein below, examples of the present invention will be set forth, describing in greater detail of the present invention. However, the present invention is not to be limited to only these examples.

Example 1

Manufacture of Metal Base

A cylinder made of an SUS430 material of which the thermal conductivity at room temperature (hereinafter referred to as $\lambda$) was 25 W/mK and the thermal expansion coefficient measured in a range from room temperature to 500° C. (hereinafter referred to as $\alpha$) was $10.4 \times 10^{-6}$/° C., having a thickness of 2 mm and a diameter of 100 mm was cut into a piece of a length of 100 mm, which was used as a metal base.

Further, two discs for lids made of the same material as the above mentioned cylinder, having a thickness of 2 mm and a diameter of 100 mm were prepared.

Subsequently, the parts were assembled into a pillar-shaped form.

More specifically, by welding the two discs for lids to the both opening ends of the metal base as a bottom face and an upper face, the openings were sealed and thus, a pillar-shaped body was formed.

Next, a surface processing step of washing and roughening the outer surface of the pillar-shaped body was carried out, in which ultrasonic washing in an alcohol solvent and a sandblasting was carried out on the pillar-shaped body.

The sandblasting was carried out for 10 minutes using SiC abrasive grain #600.

Here, the $Rz_{JIS}$ on the surface of the metal base was measured after the surface processing step, and it was 1.5 μm.

(Formation of Inorganic Material Surface Layer)

Next, 65% by weight of $MnO_2$ powder and 5% by weight of CuO powder as crystalline inorganic materials, 30% by weight of $BaO—SiO_2$ glass powder as an amorphous inorganic material were dry mixed to prepare mixed powder, and 100 parts by weight of water was added to 100 parts by weight of the mixed powder, and wet blended in a ball mill, thereby a slurry was prepared.

Further, the crystalline inorganic material and the amorphous inorganic material in this composition were crushed and mixed, and then, heated to a temperature of the melting point of the amorphous inorganic material or more and kneaded in a state where the amorphous inorganic material was molten, and cooled and solidified to form a solid, and $\lambda$ was measured using a quick thermal conductivity meter (QTM-500, made by Kyoto Electronics Manufacturing Co., Ltd.). Further, a was measured in a range from room temperature to 500° C. using a TMA (thermo mechanical analysis) apparatus (TMA8310, made by Rigaku Corporation). The results are shown in Table 1.

The coating step, in which this slurry was applied onto the outer surface of the above mentioned pillar-shaped body by spray coating, was carried out.

Subsequently, after drying the above mentioned pillar-shaped body, on which a coating layer was formed by spray coating, for two hours at 100° C., the firing step of heating and firing the pillar-shaped body for one hour at 700° C. in the air was carried out to form an inorganic material surface layer 102, and thereby, a pillar-shaped structure 100 was manufactured (see FIG. 3).

The emissivity of the formed inorganic material surface layer 102 for a wavelength in the range of 1 μm to 15 μm at room temperature was measured using a spectrophotometer (measuring apparatus: system 200 model, made by Perkin Elmer, Inc.). Further, the thickness of the formed inorganic material surface layer 102 was measured. The results are shown in Table 2.

(Formation of Through Hole)

A through hole having a length of 52 mm×a width of 52 mm was formed in the center portion on the bottom of the pillar-shaped structure 100 manufactured through the above mentioned process, in order to provide a ceramic heater which will be described later.

(Fabrication of Evaluation Apparatus)

Figure 3:
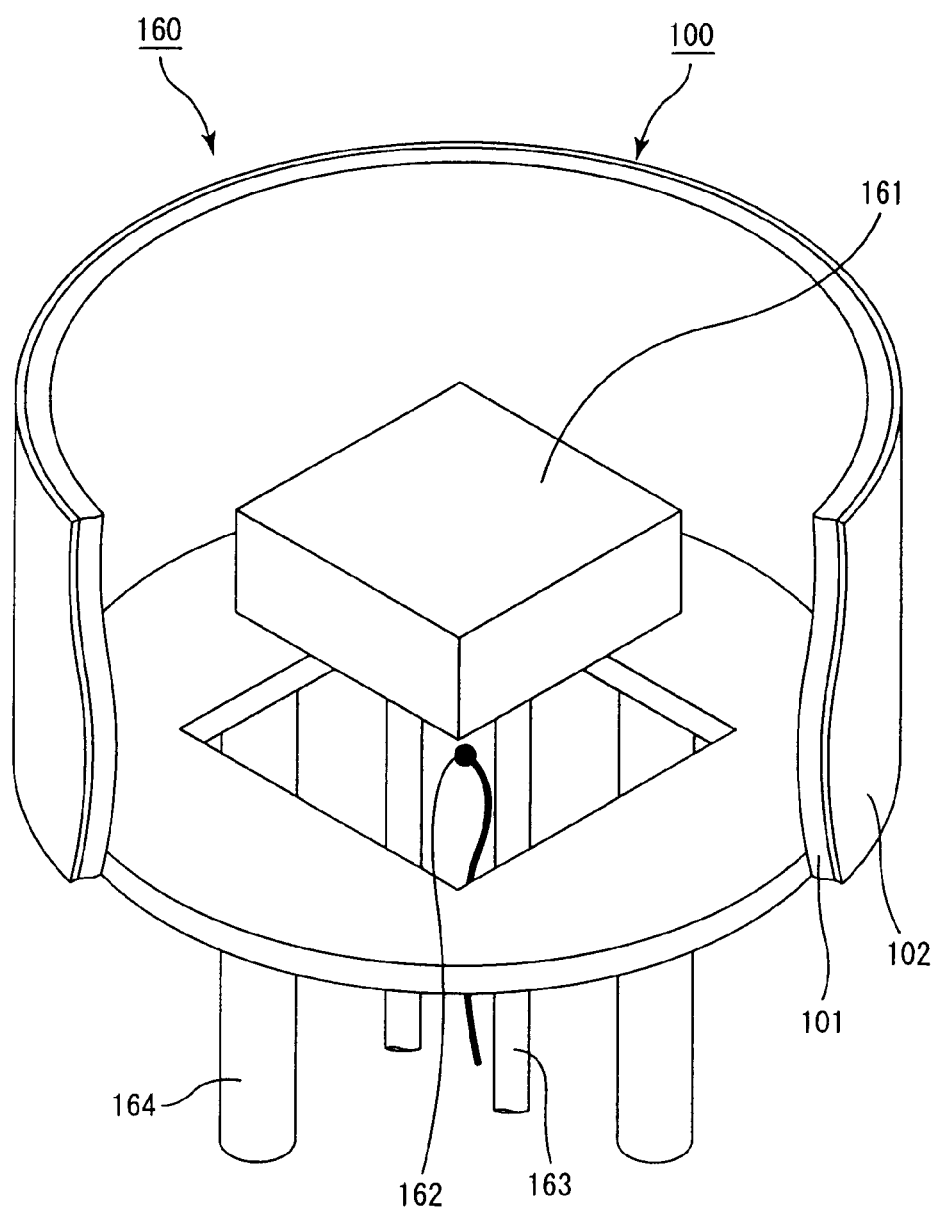
FIG. 3 is a perspective view, with a portion missing, schematically showing an evaluation apparatus for evaluating performance of the structure of the present invention.

FIG. 3 is a perspective view with a portion missing schematically showing an evaluation apparatus for evaluating the performance of the structure of the present invention. In the present view, the upper surface and the front side face are omitted.

In this evaluation apparatus 160, a ceramic heater 161 having a length of 50 mm×a width of 50 mm×a height of 20 mm is placed in the center portion of the pillar-shaped structure 100, and the temperature in the space inside the structure can be raised through heating using the heater.

Further, a thermocouple 162 is placed in a location at a distance of 10 mm from the inner bottom face of the structure 100, so that the temperature in the space inside the structure can be measured.

The ceramic heater 161 and the thermocouple 162 were installed and wired through the through hole provided at the bottom of the structure 100, and further, the ceramic heater 161 was supported at the bottom, which was joined to a supporting pillar 163.

Further, the structure 100 was mounted on a mounting pillar 164 made of the same material as the metal base 101, so that the major part of the bottom face of the structure 100 did not make a direct contact with other portions.

The performance of the structure was evaluated using the evaluation apparatus 160.

(Evaluation of Heat Insulating Property in Low Temperature Region)

2 kW of electric power was supplied to the ceramic heater 161 and the time for the temperature indicated by the installed thermocouple 162 rising to 500° C. was measured. The results are shown in Table 2.

(Evaluation of Heat Releasing Property in High Temperature Region)

The temperature indicated by the thermocouple 162 was measured as the maximum temperature, at the point in time when the amount of released heat and the supplied electric power reached a point of balance and the temperature became constant, in a state where 2 kW of electric power was being supplied to the ceramic heater 161. The results are shown in Table 2.

(Evaluation of Adhesiveness of Inorganic Material Surface Layer)

A process of supplying electric power to the ceramic heater 161 to raise the temperature in the space inside the structure to 800° C. and cooling the space to room temperature through natural heat release was considered as one cycle, and a test was carried out by repeating the process for ten cycles. After carrying out the test, whether or not the inorganic material surface layer 102 had peeled off the metal base 101 was visually observed. The results are shown in Table 2.

Examples 2 and 3

The ratio of the amorphous inorganic material, the type of crystalline material and the base material were respectively provided as shown in Table 1, and these were used to manufacture structures in the same manner as in Example 1.

Here, the ratio of the crystalline material was the ratio gained by subtracting the ratio of the amorphous inorganic material shown in Table 1 from 100%, and in the case where the crystalline material was made of two types of materials, the composition was respectively, $MnO_2$: CuO=65% by weight: 5% by weight and $MnO_2$: $Fe_3O_4$=65% by weight: 5% by weight.

In each Example and the like, λ and α of the metal base and the inorganic material surface layer, and the emissivity of the inorganic material surface layer were measured in the same manner as in Example 1. The results are shown in Table 1.

Further, in each Example and Reference Example, the surface processing step was carried out so that the $Rz_{JIS}$ on the surface of the base after surface processing became the value shown in Table 2, by changing the processing time for a sandblasting on the metal material.

Further, in each Example and Reference Example, the coating step was carried out so that the thickness of the inorganic material surface layer shown in Table 2 was provided, by changing the conditions for spray coating the slurry.

In each Example and Reference Example, the performance of the structure was evaluated using the evaluation apparatus 160, in each of the manufactured structures in the same manner as in Example 1.

The results of evaluation are collectively shown in Table 2.

Examples 4, 7, and Reference Examples 1, 2

The ratio of the amorphous inorganic material, the type of crystalline material and the base material are respectively provided as shown in Table 1, and these are used to manufacture structures in the same manner as in Example 1.

Here, the ratio of the crystalline material is the ratio gained by subtracting the ratio of the amorphous inorganic material shown in Table 1 from 100%, and in the case where the crystalline material is made of two types of materials, the composition is respectively, $MnO_2$:CuO=65% by weight:5% by weight and $MnO_2$:$Fe_3O_4$=65% by weight:5% by weight.

In each Example and the like, λ and α of the metal base and the inorganic material surface layer, and the emissivity of the inorganic material surface layer are measured in the same manner as in Example 1. The results supposed to be obtained are shown in Table 1.

Further, in each Example and Reference Example, the surface processing step is carried out so that the $Rz_{JIS}$ on the surface of the base after surface processing becomes the value shown in Table 2, by changing the processing time for a sandblasting on the metal material.

Further, in each Example and Reference Example, the coating step is carried out so that the thickness of the inorganic material surface layer shown in Table 2 is provided, by changing the conditions for spray coating the slurry.

In each Example and Reference Example, the performance of the structure is evaluated using the evaluation apparatus 160, in each of the structures to be manufactured in the same manner as in Example 1.

The results of evaluation supposed to be obtained are collectively shown in Table 2.

Example 5

Before the parts are assembled into a pillar-shaped form, the surface processing step, in which the inner surface of the metal base is washed and roughened, is carried out by executing ultrasonic washing of the metal base with cylindrical form in an alcohol solvent and then a process of sandblasting, in the same manner as in Example 1.

Further, the same surface processing step is carried out on either one face of the two discs for lids.

A slurry is prepared in the same manner as in Example 1, and the coating step of applying this slurry on the inner surface of the metal base in cylindrical form and either one face of the discs for lids (surface on which sandblasting process is carried out) by spray coating is carried out.

After that, the firing step is carried out, in the same manner as in Example 1, and thus, an inorganic material surface layer is formed.

The two discs for lids are welded to the bottom face and the upper face of the metal base and placed in such a manner that the surface on which the inorganic material surface layer is formed at the inner surface of the structure, and thereby the openings are sealed to manufacture a pillar-shaped structure.

After that, the performance of the structure is evaluated using the evaluation apparatus 160, in the same manner as in Example 1.

The conditions and the results of evaluation supposed to be obtained are collectively shown in Tables 1 and 2.

Example 6

First, a pillar-shaped structure, on the inner surface of which an inorganic material surface layer is formed, is manufactured in the same manner as in Example 5.

Next, a surface processing and the formation of an inorganic material surface layer on the outer surface are carried out on the pillar-shaped structure in the same manner as in Example 1, and thus, a structure having an inorganic material surface layer both on the outer surface and the inner surface is manufactured.

After that, the performance of the structure is evaluated using an evaluation apparatus 160, in the same manner as in Example 1.

The conditions and the results of evaluation supposed to be obtained are collectively shown in Tables 1 and 2.

Reference Example 3

A structure having an inorganic material surface layer is manufactured in the same manner as in Example 1, except that 65% by weight of quartz powder as a crystalline inorganic material, 30% by weight of BaO—SiO$_2$ glass powder and 5% by weight of fly ash as amorphous inorganic materials are dry blended to prepare mixed powder. After that, the performance of the structure is evaluated using an evaluation apparatus 160, in the same manner as in Example 1.

The conditions and the results of evaluation supposed to be obtained are collectively shown in Tables 1 and 2.

Comparative Example 1

A structure as manufactured in the same manner as in Example 1, except that no inorganic material surface layer was formed on the metal base and the discs for lids. After that, the performance of the structure was evaluated using an evaluation apparatus 160, in the same manner as in Example 1.

Further, the measurement of the emissivity was carried out in the surface of the metal base, in the same manner as in Example 1.

The conditions and the results of evaluation are collectively shown in Tables 1 and 2.

Comparative Example 2

A metal base in cylindrical form which is the same as that used in Example 1 is cut at two places parallel to the longitudinal direction, so that a metal base in cylindrical form missing the ¼ of the side face is manufactured.

After that, the above mentioned metal base in cylindrical form and discs for lids are assembled, so that a pillar-shaped body having an opening portion on the side face is manufactured, and the rest of the process is carried out in the same manner as in Example 1, and thus, a structure having an inorganic material surface layer on the outer surface is manufactured.

After that, the performance of the structure is evaluated using an evaluation apparatus 160, in the same manner as in Example 1.

The conditions and the results of evaluation supposed to be obtained are collectively shown in Tables 1 and 2.

Here, the structure to be manufactured in Comparative Example 2 has a form of which the side is not closed, and therefore, is a structure of which the base does not have the form of an annular body.

TABLE 1

| | ratio of amorphous inorganic material (wt %) | crystalline material | base material | thermal conductivity (W/mK) base | thermal conductivity (W/mK) inorganic material surface layer | thermal expansion coefficient α ($10^{-6}/°C$) base | thermal expansion coefficient α ($10^{-6}/°C$) inorganic material surface layer |
|---|---|---|---|---|---|---|---|
| Example 1 | 30 | MnO$_2$, CuO | SUS430 | 25 | 1.2 | 10.4 | 8.3 |
| Example 2 | 30 | MnO$_2$, Fe$_3$O$_4$ | SUS430 | 25 | 1.3 | 10.4 | 7.8 |
| Example 3 | 70 | MnO$_2$, CuO | SUS304 | 18 | 1.2 | 17.2 | 9.5 |
| Example 4 | 10 | MnO$_2$, Fe$_3$O$_4$ | SUS430 | 25 | 1.3 | 10.4 | 7.5 |
| Example 5 | 30 | MnO$_2$, CuO | SUS430 | 25 | 1.2 | 10.4 | 8.3 |
| Example 6 | 30 | MnO$_2$, CuO | SUS430 | 25 | 1.2 | 10.4 | 8.3 |
| Example 7 | 30 | mullite | SUS304 | 18 | 1.2 | 17.2 | 6.3 |
| Reference Example 1 | 90 | MnO$_2$, CuO | SUS304 | 18 | 1.2 | 17.2 | 10.1 |
| Reference Example 2 | 30 | Al$_2$O$_3$ | SUS430 | 25 | 2.8 | 10.4 | 8.5 |
| Reference Example 3 | 35 | quartz powder | SUS430 | 25 | 0.8 | 10.4 | 5.4 |
| Comparative Example 1 | — | — | SUS430 | 25 | — | 10.4 | — |
| Comparative Example 2 | 30 | MnO$_2$, CuO | SUS430 | 25 | 1.2 | 10.4 | 8.3 |

TABLE 2

| | annular body (*) | emissivity | coated surface | thickness of inorganic material surface layer A (μm) | degree of irregularities on surface of base (Rz$_{JIS}$: μm) | B/A | time for raising temperature (seconds) (RT→ 500° C.) | maximum temperature (° C.) | Presence of peel-off |
|---|---|---|---|---|---|---|---|---|---|
| Example 1 | ○ | 0.96 | outer surface | 20 | 1.5 | 0.075 | 162 | 763 | Not present |
| Example 2 | ○ | 0.94 | outer surface | 30 | 0.5 | 0.017 | 155 | 785 | Not present |
| Example 3 | ○ | 0.96 | outer surface | 5 | 1.5 | 0.300 | 172 | 739 | Not present |
| Example 4 | ○ | 0.98 | outer surface | 25 | 1.2 | 0.048 | 177 | 658 | Not present |
| Example 5 | ○ | 0.96 | outer surface | 20 | 1.5 | 0.075 | 158 | 792 | Not present |
| Example 6 | ○ | 0.96 | outer surface + inner surface | 20 | 1.5 | 0.075 | 140 | 365 | Not present |
| Example 7 | ○ | 0.94 | outer surface | 5 | 1.5 | 0.300 | 183 | 755 | Present |
| Reference Example 1 | ○ | 0.92 | outer surface | 30 | 0.2 | 0.007 | 188 | 710 | Present |
| Reference Example 2 | ○ | 0.96 | outer surface | 25 | 1.2 | 0.048 | 205 | 644 | Not present |

TABLE 2-continued

| | annular body (*) | emissivity | coated surface | thickness of inorganic material surface layer A (μm) | degree of irregularities on surface of base (Rz$_{JIS}$: μm) | B/A | time for raising temperature (seconds) (RT→ 500° C.) | maximum temperature (° C.) | Presence of peel-off |
|---|---|---|---|---|---|---|---|---|---|
| Reference Example 3 | ○ | 0.42 | outer surface | 20 | 1.3 | 0.065 | 145 | 932 | Not present |
| Comparative Example 1 | ○ | 0.30 | — | — | 1.5 | — | 250 | 980 | — |
| Comparative Example 2 | X | 0.96 | outer surface | 20 | 1.5 | 0.075 | 275 | 583 | Not present |

(*) ○: the form of base is annular body
X: the form of base is not annular body

As is clear from Tables 1 and 2, the time for raising the temperature is short and the maximum temperature is low in the structures manufactured in Examples 1 to 7.

In the structure manufactured in Comparative Example 1, the time for raising the temperature is long and the maximum temperature is high. The reason for this is considered that the thermal conductivity is high and the heat insulating property at low temperatures is poor, and further, the emissivity is low and the heat releasing property at high temperatures is poor due to the absence of inorganic material surface layer.

The time for raising the temperature is presumed to be long and the maximum temperature is presumed to be low in the structure manufactured in Comparative Example 2. The reason for this is considered that the base does not have the form of an annular body, and therefore, the high temperature gas leaks to the external space through the opening, making the heat insulating property poor.

Further, the time for raising the temperature is very short and the maximum temperature is extremely low, and there is no peeling of the inorganic material surface layer in any of the structures manufactured in Examples 1 to 6.

From the above results, a structure formed of a base made of a metal and an inorganic material surface layer made of crystalline and amorphous organic materials, the thermal conductivity of the above mentioned inorganic material surface layer at low temperatures is lower than the thermal conductivity of the above mentioned base, the infrared emissivity of the above mentioned inorganic material surface layer is higher than the infrared emissivity of the above mentioned base, and the above mentioned base is an annular body, has excellent heat insulating property in a low temperature region and excellent heat releasing property in a high temperature region.

In particular, it can be seen that when the thermal conductivity of the above mentioned inorganic material surface layer at room temperature is in the range of 0.1 W/mK to 2 W/mK, the heat insulating property can be improved a great deal, when the emissivity of the above mentioned inorganic material surface layer for a wavelength in the range of 1 μm to 15 μm at room temperature is in the range of 0.7 to 0.98, the heat releasing property can be improved a great deal, and when the degree of irregularities (Rz$_{JIS}$) on the surface of the base is 1/60 or more of the thickness of the above described inorganic material surface layer, the above described inorganic material surface layer can be made to adhere firmly to the base.

In the structure of the present invention, the base made of a metal material is an annular body surrounding a heat source (heater, furnace body or fluid), and as an inorganic material surface layer having thermal conductivity lower than thermal conductivity of the base and infrared emissivity higher than that of the base is formed on the surface (inner surface or outer surface) of the base, heat release from the inside of the structure is blocked to secure heat insulating property in a low temperature region, where the heat releasing properties depends on the thermal conduction, and heat release is accelerated to decrease the temperature inside the structure in a high temperature region, where the heat releasing property depends on radiation.

What is claimed as new and desired to be secured by Letters Patent of the United States is:

1. An annular structure comprising:
   a base made of a metal and formed into an annular body having a cylindrical form or a cylindroid form; and
   an inorganic material surface layer adhered on an outer surface of the annular body,
   wherein said inorganic material surface layer has a thermal conductivity which is lower than a thermal conductivity of said base, said inorganic material surface layer has an infrared emissivity which is higher than an infrared emissivity of said base, the inorganic material surface layer is produced by a process comprising solidifying a slurry on the outer surface of the annular body, the slurry comprises powders of a crystalline inorganic material and an amorphous inorganic material suspended therein, said crystalline inorganic material comprises at least one oxide of a transition metal, and the crystalline inorganic material in powder form and the amorphous inorganic material in powder form are mixed in the powders such that the inorganic material surface layer comprises the crystalline inorganic material in an amount of from about 30 wt. % to about 70 wt. %.

2. The annular structure according to claim 1, wherein the thermal conductivity of said inorganic material surface layer at room temperature is at least about 0.1 W/mK and at most about 2.0 W/mK.

3. The annular structure according to claim 1, wherein the emissivity of said inorganic material surface layer at room temperature at a wavelength in the range of 1 μm to 15 μm is at least about 0.70 and at most about 0.98.

4. The annular structure according to claim 1, wherein a degree of irregularities (Rz$_{JIS}$) on the surface of said base forming the outer surface of the annular body is about 1/60 or more of a thickness of said inorganic material surface layer.

5. The annular structure according to claim 1, wherein the metal of said base includes steel, iron, copper, or stainless steel.

6. The annular structure according to claim 1, wherein said crystalline inorganic material comprises at least one metal oxide selected from the group consisting of manganese dioxide, manganese oxide, iron oxide, cobalt oxide, copper oxide and chromium oxide.

7. The annular structure according to claim 1, wherein said amorphous inorganic material comprises at least one material selected from the group consisting of barium glass, boron glass, strontium glass, alumina-silicate glass, soda zinc glass and soda barium glass.

8. The annular structure according to claim 1, wherein the softening temperature of said amorphous inorganic material is at least about 400° C. and at most about 1000° C.

9. The annular structure according to claim 1, wherein the difference in the thermal expansion coefficient between said inorganic material surface layer and said base is about $10 \times 10^{-6}$/° C. or less.

10. The annular structure according to claim 1, wherein the inorganic material surface layer is adhered on the outer surface of the annular body and an inner surface of the annular body.

11. The annular structure according to claim 1, wherein the crystalline inorganic material is a mixture of at least two transition metal oxides.

12. The annular structure according to claim 1, wherein the crystalline inorganic material is a mixture of two transition metal oxides selected from the group consisting of $MnO_2$, CuO and $Fe_3O_4$.

13. The annular structure according to claim 1, wherein the crystalline inorganic material is at least one metal oxide selected from the group consisting of manganese dioxide, manganese oxide, iron oxide, cobalt oxide, copper oxide and chromium oxide.

14. The annular structure according to claim 1, wherein the crystalline inorganic material has a thermal expansion coefficient of at least about $8 \times 10^{-6}$/° C. and at most about $9 \times 10^{-6}$/° C.

15. The annular structure according to claim 1, wherein the crystalline inorganic material has a thermal conductivity of at least about 0.5 W/mK and at most about 2.0 W/mK at room temperature.

16. The annular structure according to claim 1, wherein the amorphous inorganic material is at least one material selected from the group consisting of barium glass, boron glass, strontium glass, alumina-silicate glass, soda zinc glass and soda barium glass.

17. The annular structure according to claim 1, wherein the amorphous inorganic material has a thermal expansion coefficient of at least about $8 \times 10^{-6}$/° C. and at most about $25 \times 10^{-6}$/° C.

18. The annular structure according to claim 1, wherein the amorphous inorganic material has a thermal conductivity of at least about 0.1 W/mK and at most about 1.2 W/mK at room temperature.

19. The annular structure according to claim 1, wherein the crystalline inorganic material in powder form and the amorphous inorganic material in powder form are mixed in the powders such that the inorganic material surface layer comprises the crystalline inorganic material in an amount of from about 10 wt. % to about 90 wt. %.

20. The annular structure according to claim 4, wherein the inorganic material surface layer has the thickness of about 2 μm to about 50 μm.

* * * * *